(12) United States Patent
Kang et al.

(10) Patent No.: US 10,586,893 B2
(45) Date of Patent: Mar. 10, 2020

(54) LIGHT EMITTING DIODE HAVING DECREASED EFFECTIVE AREA OF ACTIVE LAYER, AND MANUFACTURING METHOD THEREOF

(71) Applicant: SAMSUNG ELECTRONICS CO., LTD., Suwon-si (KR)

(72) Inventors: Jin-mo Kang, Suwon-si (KR); Ji-Hoon Kang, Seoul (KR); Seong-woo Cho, Yongin-si (KR); Ji-young Kang, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/923,754

(22) Filed: Mar. 16, 2018

(65) Prior Publication Data

US 2019/0123240 A1   Apr. 25, 2019

(30) Foreign Application Priority Data

Oct. 23, 2017   (KR) .......................... 10-2017-0137640

(51) Int. Cl.
*H01L 33/38* (2010.01)
*H01L 33/14* (2010.01)
(Continued)

(52) U.S. Cl.
CPC ............ *H01L 33/38* (2013.01); *H01L 33/007* (2013.01); *H01L 33/14* (2013.01); *H01L 33/20* (2013.01);
(Continued)

(58) Field of Classification Search
CPC ....... H01L 33/38; H01L 33/007; H01L 33/14; H01L 33/20; H01L 33/32; H01L 33/44;
(Continued)

(56) References Cited

U.S. PATENT DOCUMENTS 6,429,460 B1   8/2002   Chen et al.
8,686,397 B2   4/2014   Nakamura et al.
(Continued)

FOREIGN PATENT DOCUMENTS

CN   101540356 A   9/2009
EP   3089225 A1   11/2016
(Continued)

OTHER PUBLICATIONS

International Search Report (PCT/ISA/210) dated Dec. 24, 2018 issued by the International Searching Authority in International Application No. PCT/KR2018/011783.
(Continued)

*Primary Examiner* — Shahed Ahmed
(74) *Attorney, Agent, or Firm* — Sughrue Mion, PLLC

(57) ABSTRACT

A method of manufacturing a light emitting diode (LED) is provided. The method includes forming an n-type semiconductor layer on a substrate, forming an n-type electrode in a first region of the n-type semiconductor layer, forming an active layer in a second region of the n-type semiconductor layer, the second region being a region other than the first region, forming a p-type semiconductor layer on the active layer, and forming a resistance layer by etching regions of the active layer and the p-type semiconductor layer.

16 Claims, 17 Drawing Sheets

(51) Int. Cl.
  *H01L 33/20* (2010.01)
  *H01L 33/44* (2010.01)
  *H01L 33/00* (2010.01)
  *H01L 33/32* (2010.01)
  *H01L 33/40* (2010.01)
  *H01L 33/42* (2010.01)
  *H01L 33/06* (2010.01)

(52) U.S. Cl.
  CPC .............. *H01L 33/32* (2013.01); *H01L 33/40* (2013.01); *H01L 33/44* (2013.01); *H01L 33/06* (2013.01); *H01L 33/42* (2013.01); *H01L 2933/0016* (2013.01); *H01L 2933/0025* (2013.01)

(58) Field of Classification Search
  CPC . H01L 33/06; H01L 33/42; H01L 2933/0016; H01L 2933/0025; H01L 33/36
  See application file for complete search history.

(56) References Cited

U.S. PATENT DOCUMENTS

| | | | |
|---|---|---|---|
| 8,912,028 B2 | 12/2014 | Jung et al. | |
| 9,105,813 B1 | 8/2015 | Chang | |
| 2004/0079947 A1* | 4/2004 | Lan | H01L 33/04 257/79 |
| 2004/0169184 A1* | 9/2004 | Udagawa | C23C 16/30 257/86 |
| 2005/0230696 A1* | 10/2005 | Shakuda | H01L 33/007 257/94 |
| 2011/0068349 A1* | 3/2011 | Shinohara | H01L 33/42 257/76 |
| 2012/0138986 A1* | 6/2012 | Chung | H01L 29/452 257/98 |
| 2013/0306976 A1* | 11/2013 | Haruta | H01L 33/32 257/76 |

FOREIGN PATENT DOCUMENTS

| | | |
|---|---|---|
| JP | 4945977 B2 | 6/2012 |
| JP | 2014192274 A | 10/2014 |
| JP | 2016213441 A | 12/2016 |
| KR | 2002-0068363 A | 8/2002 |
| KR | 101241533 B1 | 3/2013 |
| KR | 1020140039032 A | 3/2014 |
| WO | 00/54342 A1 | 9/2000 |
| WO | 01/41223 A1 | 6/2001 |
| WO | 2013/044817 A1 | 4/2013 |

OTHER PUBLICATIONS

Written Opinion (PCT/ISA/237) dated Dec. 24, 2018 issued by the International Searching Authority in International Application No. PCT/KR2018/011783.

* cited by examiner

1000

LIGHT EMITTING DIODE HAVING DECREASED EFFECTIVE AREA OF ACTIVE LAYER, AND MANUFACTURING METHOD THEREOF

CROSS-REFERENCE TO RELATED APPLICATION

This application claims priority under 35 U.S.C. § 119 from Korean Patent Application No. 10-2017-0137640, filed on Oct. 23, 2017 in the Korean Intellectual Property Office, the disclosure of which is incorporated herein by reference in its entirety.

BACKGROUND OF THE INVENTION

Field

Apparatuses and methods consistent with the disclosure relate to a light emitting diode (LED) apparatus and a manufacturing method thereof, and more particularly, to an LED apparatus including a resistance layer and a manufacturing method thereof.

Description of the Related Art

A light emitting diode (LED) has a relatively long lifespan, low power consumption, and a rapid response speed, and thus, is used in various types of display apparatus and lighting devices.

Pixels per inch (ppi) and luminance of a display vary according to a purpose, a size, and the like of a display apparatus. Therefore, a luminous intensity required for each pixel of the display may vary. In response, a required luminous intensity may be satisfied by controlling an amount of current or controlling a chip size of an LED.

However, if only the amount of current is controlled, efficiency may be lowered, and if the chip size is controlled, various kinds of production lines may be required, thereby increasing unit cost of production.

SUMMARY

In accordance with an aspect of the disclosure, there is provided a method of manufacturing a light emitting diode (LED), the method including forming an n-type semiconductor layer on a substrate, forming an n-type electrode in a first region of the n-type semiconductor layer, forming an active layer in a second region of the n-type semiconductor layer, the second region being a region other than the first region, forming a p-type semiconductor layer on the active layer, and forming a resistance layer by etching regions of the active layer and the p-type semiconductor layer.

The forming of the resistance layer may include forming a high resistance layer having a resistance value higher than or equal to a preset resistance to a height equal to the p-type semiconductor layer by etching at least portions of an outer region of the active layer and an outer region of the p-type semiconductor layer, wherein the method may further includes forming a p-type electrode in a region of the p-type semiconductor layer.

The forming of the resistance layer may include forming a high resistance layer having a resistance value higher than or equal to a preset resistance to a height equal to the p-type semiconductor layer by etching at least portions of an outer region of the active layer and an outer regions of the p-type semiconductor layer, and forming a low resistance layer having a resistance value lower than the preset resistance on the high resistance layer and the p-type semiconductor layer, wherein the method may further include forming a p-type electrode in a region of the low resistance layer.

The method may further include forming a p-type electrode on the p-type semiconductor layer, wherein the forming of the resistance layer may include forming an insulating layer by etching a portion of a region, where the active layer, the p-type semiconductor layer, and the p-type electrode are stacked, from the p-type electrode to the active layer.

The p-type electrode may be divided into a first p-type electrode and a second p-type electrode by the insulating layer, wherein the method may further include forming a p-type pad configured to connect only on one of the first p-type electrode and the second p-type electrode to an external substrate.

The first region may be an outer region of the n-type semiconductor layer, and the second region may be a rectangular region including a central portion of an inner region other than the outer region in the n-type semiconductor layer, wherein the forming of the resistance layer includes etching a region wherein the n-type electrode, the n-type semiconductor layer, the active layer, the p-type semiconductor layer, and the p-type electrode are stacked to cross from a portion of the n-type electrode formed at first edge of the first region and a portion of the n-type electrode formed at a second edge opposite to the first edge, and forming the insulating layer by filling the etched region with an insulating material.

The type electrode may be divided into a first n-type electrode and a second n-type electrode by the insulating layer, wherein the method may further include forming an n-type pad configured to connect only on one of the first n-type electrode and the second n-type electrode to an external substrate.

The n-type electrode may be divided into a first n-type electrode and a second n-type electrode by the insulating layer, wherein the method may further include forming first n-type pad and second n-type pad to respectively connect the first n-type electrode and the second n-type electrode to an external substrate.

In accordance with another aspect of the disclosure, there is provided a light emitting diode (LED) including a substrate, an n-type semiconductor layer formed on the substrate, an n-type electrode formed in a first region of the n-type semiconductor layer, an active layer formed in a second region of the n-type semiconductor layer, the second region being a region other than the first region, a p-type semiconductor layer formed on the active layer, and a resistance layer formed in regions of the active layer and the p-type semiconductor layer.

The resistance layer may include a high resistance layer formed to a height equal to the p-type semiconductor layer in etched portions of outer regions of the active layer and the p-type semiconductor layer to have a resistance value higher than or equal to a preset resistance, wherein the LED may further include a p-type electrode formed in a region of the p-type semiconductor layer.

The resistance layer may include a high resistance layer formed to a height equal to the p-type semiconductor layer in etched portions of outer regions of the active layer and the p-type semiconductor layer configured to have a resistance value higher than or equal to a preset resistance, and a low resistance layer formed on the high resistance layer and the p-type semiconductor layer configured to have a resistance value lower than the preset resistance, wherein the LED may further include a p-type electrode formed in a region of the low resistance layer.

The LED may further include a p-type electrode formed on the p-type semiconductor layer, wherein the resistance layer may include an insulating layer connecting the p-type electrode to the active layer in a region where the active layer, the p-type semiconductor layer, and the p-type electrode are stacked.

The p-type electrode may be divided into a first p-type electrode and a second p-type electrode by the insulating layer, wherein the LED may further include a p-type pad connecting only one of the first p-type electrode and the second p-type electrode to an external substrate.

The first region may be an outer region of the n-type semiconductor layer, and the second region may be a rectangular region including a central portion of an inner region other than the outer region in the n-type semiconductor layer, wherein the resistance layer may include an insulating layer formed to cross from a portion of the n-type electrode formed at a first edge of the first region and a portion of the n-type electrode formed at a second edge opposite to the first edge in a region where the n-type semiconductor layer, the active layer, the p-type semiconductor layer, and the p-type electrode are stacked.

The n-type electrode may be divided into a first n-type electrode and a second n-type electrode by the insulating layer, wherein the LED may further include an n-type pad connecting only one of the first n-type electrode and the second n-type electrode to an external substrate.

The n-type electrode may be divided into a first n-type electrode and a second n-type electrode by the insulating layer, wherein the LED may further include a first n-type pad and a second n-type pad respectively formed on the first n-type electrode and the second n-type electrode respectively connecting the first n-type electrode and the second n-type electrode to an external substrate.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF THE EXEMPLARY EMBODIMENTS

Figure 1:
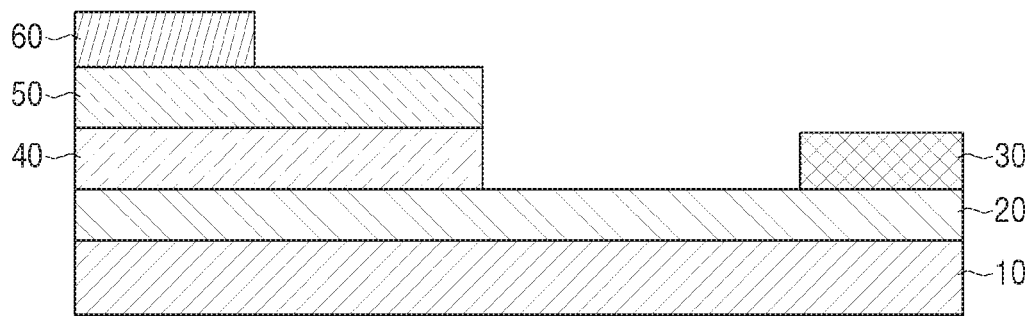
FIG. 1 is a cross-sectional view illustrating a light emitting diode (LED) according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of" and "at least one selected from" when preceding a list of elements, modify the entire list of elements and do not modify the individual elements of the list. For example, "at least one selected from a, b, and c," should be understood as including only a, only b, only c, both a and b, both a and c, both b and c, or all of a, b, and c.

The terms used in the present disclosure are for the purpose of describing embodiments only and are not intended to be limiting. The singular forms are intended to include the plural forms as well, unless the context clearly indicates otherwise. Throughout the specification, when a part is connected to another part, the part is not only directly connected to another part but also electrically connected to another part with another device intervening in them. If it is assumed that a certain part includes a certain component, the term "including," "comprising," and "having" mean that a corresponding component may further include other components unless a specific meaning opposed to the corresponding component is written.

The use of "a," "an," and "the" and other demonstratives similar thereto may correspond to both a singular form and a plural form. Unless the order of operations of a method according to the disclosure is explicitly mentioned or described otherwise, the disclosure is not limited by the order the operations are mentioned.

The phrase used in various parts of the present specification, such as "in some embodiments" or "in an embodiment" does not necessarily indicate the same embodiment.

The matters defined in the description, such as detailed construction and elements, are provided to assist in a comprehensive understanding of the disclosure. Thus, it is apparent that the embodiments may be carried out without those specifically defined matters. Also, well-known functions or constructions are not described in detail.

Unless otherwise defined, when an element includes another element, it may mean that the element further include other elements without excluding the other elements.

Various elements and regions illustrated in the drawings are schematically drawn. Therefore, the technical spirit of the present disclosure is not limited by relative sizes or gaps drawn in the attached drawings.

FIG. 1 is a cross-sectional view illustrating a light emitting diode (LED) 1000 according to an embodiment.

Referring to FIG. 1, the LED 1000 includes a substrate 10, an n-type semiconductor layer 20, an n-type electrode 30, an active layer 40, a p-type semiconductor layer 50, and a p-type electrode 60.

The substrate 10 may be a semiconductor growth substrate capable of growing a semiconductor material on an upper surface thereof. In detail, the substrate 10 may be, for example, a sapphire substrate, a silicon (Si) substrate, a zinc oxide (ZnO) substrate, a nitride semiconductor substrate, or a template substrate on which at least one selected from gallium nitride (GaN), indium gallium nitride (InGaN), aluminum gallium nitride (AlGaN), and an aluminum indium gallium nitride (AlInGaN) is stacked. For example, the substrate 10 may be the sapphire substrate capable of growing a nitride layer having a hexagonal crystal system.

However, the substrate 10 is not limited thereto and may be a metal substrate formed of a metal material such as copper (Cu), chromium (Cr), nickel (Ni), silver (Ag), gold (Au), molybdenum (Mo), palladium (Pd), tungsten (W), aluminum (Al), or the like. Hereinafter, as an example, the substrate 10 will be described as the sapphire substrate.

The n-type semiconductor layer 20 may be formed on the substrate 10. Here, the n-type semiconductor layer 20 may be a nitride-based semiconductor layer, i.e., a semiconductor layer formed of at least one selected from GaN, InAlGaN, AlGaN, InGaN, aluminum nitride (AlN), indium nitride (InN), and aluminum indium nitride (AlInN). For example, the n-type semiconductor layer 20 may be n-type doped n-GaN.

The n-type electrode 30 may be electrically connected to the n-type semiconductor layer 20. Since the n-type electrode 30 is electrically connected to the n-type semiconductor layer 20, electrons may be injected from the n-type electrode 30 into the n-type semiconductor layer 20.

According to an embodiment, the n-type electrode 30 may be formed in a first region of the n-type semiconductor layer 20 after the n-type semiconductor layer 20 is formed on the substrate 10. Here, the first region is not limited to a particular region of the n-type semiconductor layer 20 and may be various types of regions according to a manufacturing process, a manufacturing purpose, and the like. For example, the first region may be one edge region of the n-type semiconductor layer 20 or an outer region surrounding four sides on the n-type semiconductor layer 20.

According to an embodiment, after the n-type semiconductor layer 20 is etched so as to expose a portion of an upper part of the n-type semiconductor layer 20, the n-type electrode 30 may be formed in the etched region. For example, the region that is etched and exposed may have a depth between about 1 μm and about 3 μm. The n-type electrode 30 may be formed so as to have the same height as the depth of the region that is etched and exposed in the n-type semiconductor layer 20. However, the n-type electrode 30 is not limited thereto and may be formed to various heights in various types of regions on the n-type semiconductor layer 20 in order to inject electrons into the n-type semiconductor layer 20.

The active layer 40 may be formed in a second region which is included in regions other than the first region in the n-type semiconductor layer 20. Here, the second region refers to a region other than the region where the n-type electrode 30 is formed in the n-type semiconductor layer 20.

The active layer 40 is a layer that emits light having preset energy by recombination of holes injected through the p-type semiconductor layer 50 and electrons injected through the n-type semiconductor layer 20. Here, the active layer 40 may be a layer formed of a single material, such as InGaN or the like, or a single quantum well structure or a multi-quantum well (MQW) structure where quantum barrier layers alternate with quantum well layers, e.g., a GaN/InGaN structure, may be used if the active layer 40 is formed of nitride semiconductor.

The p-type semiconductor layer 50 may be formed on the active layer 40. The p-type semiconductor layer 50 may be a nitride-based semiconductor layer, i.e., a semiconductor layer formed of at least one of selected from GaN, InAlGaN, AlGaN, InGaN, AN, InN, and AlInN. For example, the p-type semiconductor layer 50 may be p-type doped p-GaN.

The p-type electrode 60 may be formed on the p-type semiconductor layer 50 and may be electrically connected to the p-type semiconductor layer 50. For example, the p-type electrode 60 may be formed to cover an upper surface of the p-type semiconductor layer 50. For example, the p-type semiconductor electrode 60 may be formed of at least one selected from indium tin oxide (ITO), aluminum zinc oxide (AZO), indium zinc oxide (IZO), ZnO, ZnO:Ga (GZO), $In_2O_3$, $SnO_2$, CdO, $CdSnO_4$, and $Ga_2O_3$.

If the p-type electrode 60 is electrically connected to the p-type semiconductor layer 50, holes may be injected from the p-type electrode 60 into the p-type semiconductor layer 50. As described above, if the n-type electrode 30 is electrically connected to the n-type semiconductor layer 20, electrons may be injected from the n-type electrode 30 into the n-type semiconductor layer 20. Also, if the p-type electrode 60 injects holes into the p-type semiconductor layer 50, the active layer 40 positioned between the n-type semiconductor layer 20 and the p-type semiconductor layer 50 may emit light having preset energy by recombination of electrons and holes.

The LED 1000 according to an embodiment may be used in display apparatuses having various sizes such as a mobile device, a television (TV), digital signage, and the like. Pixels per inch (ppi) and luminance of a display may vary according to a size of the display, and thus, a luminous intensity required for each pixel of the display may vary.

For example, a display provided in a smartphone requires specifications of 400 ppi and 350 nit, and thus, a luminous intensity required for each pixel of the display is 0.00139 mCd. As another example, a large display such as digital signage requires specifications of 20 ppi and 1000 nit, and thus, a luminous intensity required for each pixel of the large display is 1.61 mCd. Based on these two examples described above, a difference in a luminous intensity required for each pixel may exceed 1,000 times according to a size difference in the display.

A method of manufacturing the LED 1000 according to an embodiment may control not only an amount of current used for light emitting of the LED 1000 but may also control an area, a size, and the like of the active layer 40 in a process of manufacturing the LED 1000 if a required intensity is changed according to a use purpose of the LED 1000 (e.g., according to a size of a display).

For example, a display requiring a relatively low luminous intensity may need to be manufactured. In this case, the entire size of the LED 1000 may be controlled by manufacturing the substrate 100 in a small area. However, in this case, several problems may occur, i.e., manufacturing cost increases or a production line is required to be diversified. The LED 1000 according to an embodiment may maintain areas of other layers such as the substrate 10, the n-type semiconductor layer 20, and the like, satisfy a required luminous intensity mCd by controlling an area of the active layer 40 formed on the n-type semiconductor layer 20, and increase a current intensity $A/cm^2$ and external quantum efficiency (EQE). The current intensity and the EQE will be described in detail later with reference to FIG. 8. Hereinafter, various embodiments for controlling an effective area of the active layer 40 by providing the LED 1000 with a resistance layer will be described.

The terms "deposition", "growth", "stack", and the like used herein are used as the same meanings as a meaning of a formation of a semiconductor material layer. Layers or thin films that are formed according to various embodiments may be grown in a growth chamber by using metal-organic chemical vapor deposition (MOCVD) or molecular beam epitaxy (MBE) or may be deposited by using various methods such as plasma-enhanced CVD (PECVD), atmospheric pressure CVD (APCVD), low pressure CVD (LP- CVD), ultrahigh vacuum CVD (LHCVD), physical vapor deposition (PVD), an electron beam method, a resistance heat method, and the like.

Figure 2A:
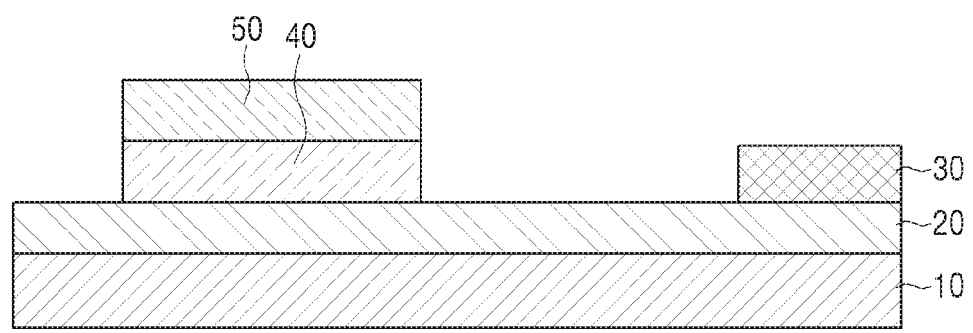
FIGS. 2A and 2B are cross-sectional views illustrating a method of manufacturing an LED according to an embodiment.
Figure 2B:
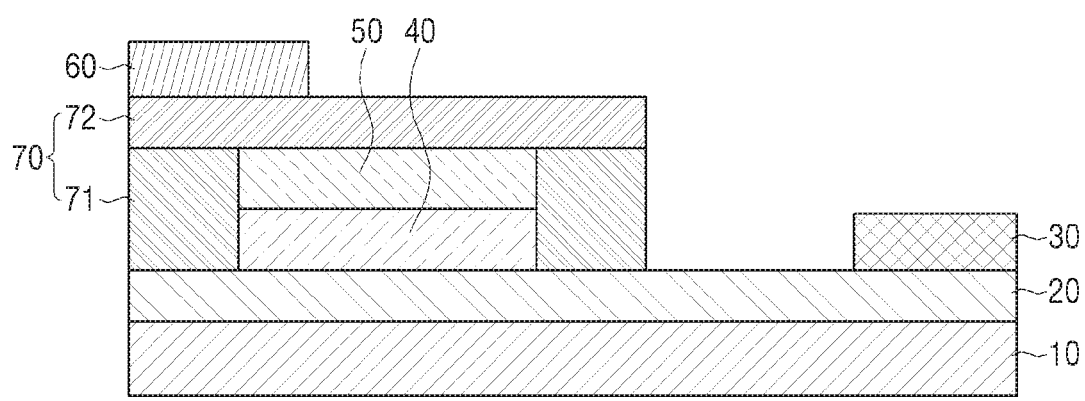

FIGS. 2A and 2B are cross-sectional views illustrating a method of manufacturing the LED 1000 according to an exemplary embodiment of the present invention.

Referring to FIG. 2A, in the method of manufacturing the LED 1000 according to an embodiment, the substrate 10 may be provided, and the n-type semiconductor layer 20, the n-type electrode 30, the active layer 40, and the p-type semiconductor layer 50 may be deposited.

Regions of the active layer 40 and the p-type semiconductor layer 50 may be etched. Here, the regions may refer to portions of outer regions of the active layer 40 and the p-type semiconductor layer 50. For example, portions of outer regions of the active layer 40 and the p-type semiconductor layer 50 may be etched, and a portion of the n-type semiconductor layer 20 formed underneath the active layer 40 may not be etched. However, embodiments are not limited thereto, and etching may be performed to a preset depth in the n-type semiconductor layer 20.

According to an embodiment, the active layer 40 and the p-type semiconductor layer 50 formed in a region of the n-type semiconductor layer 20 may be etched in mesa structures. According to an embodiment, etching may be performed to a preset depth of the n-type semiconductor layer 20. A patterning process may be various types of processes such as a photolithography process, an imprinting process, and the like. Also, an etching process may be wet etching using chemicals, dry etching such as plasma etching using a reactive gas, reactive ion etching (RIE) using an ion impact effect, or the like, or a laser ablation process using a laser.

Referring to FIG. 2B, a resistance layer 70 may be formed in etched regions of the active layer 40 and the p-type semiconductor layer 50. Here, a material included in the resistance layer 70 is distinguished from the active layer 40. Unlike in the active layer 40, recombination of electrons and holes is not possible in the resistance layer 70, and light is not emitted from the resistance layer 70.

For example, the resistance layer 70 may include a high resistance layer 71 formed of a material having a resistance value higher than or equal to a preset resistance, i.e., a high resistor. However, the high resistance layer 71 is not limited thereto and may be formed of an insulating material providing an electrical insulation. For example, the high resistance layer 71 may be formed of polyimide, SiNx, or the like or may be formed of a material having larger bandgap energy than the active layer 40 and may include AlGaN or AlInGaN.

The resistance layer 70 may be formed in an etched region of the active layer 40. Therefore, if an area of the resistance layer 70 increases, an area of the active layer 40 may decrease.

The p-type electrode 60 may be formed above the high resistance layer 71 and the p-type semiconductor layer 50. Here, the p-type electrode 60 may inject holes into the p-type semiconductor layer 50, and the holes injected into the p-type semiconductor layer 50 may be recombined with electrons in the active layer 40. The holes injected by the p-type electrode 60 may not flow into the high resistance layer 71. Since a region of the LED 1000 emitting light is the active layer 40, the region emitting the light decreases with an increase in an area of the high resistance layer 71.

As shown in FIG. 2B, the high resistance layer 71 according to an embodiment may be formed to the same height as the p-type semiconductor layer 50. However, the high resistance layer 71 is not limited thereto and may be formed to various heights in various regions that are formed in an etched region of the active layer 40 so as to reduce an effective area of the active layer 40.

The resistance layer 70 according to an embodiment may include the high resistance layer 71 and a low resistance layer 72. Here, the low resistance layer 72 may be formed of a material having a resistance value lower than a preset resistance, i.e., a low resistor. Unlike the high resistor, the low resistor may be a material through which electrons and holes may pass. For example, the low resistor may be a metal material such as Cu, Cr, Ni, Ag, Au, Mo, Pd, W, Al, or the like.

Referring to FIG. 2B, the low resistance layer 72 may be formed in a structure covering upper surfaces of the high resistance layer 71 and the p-type semiconductor layer 50. The p-type electrode 60 may be formed in a region of the low resistance layer 72. Since the low resistance layer 72 includes the material through which electrons and holes may pass, the holes injected by the p-type electrode 60 may be injected into the p-type semiconductor layer 50 through the low resistance layer 72.

In a manufacturing method according to an embodiment, according to a use purpose of an LED, i.e., a size of a display apparatus, the active layer 40 may be etched, the high resistance layer 71 may be formed in the etched region, and an area of the high resistance layer 71 may be controlled in a manufacturing process. An effective area of the active layer 40 decreases with an increase in an etched region in the active layer 40 and an increase in an area of the high resistance layer 71. As the effective area of the active layer 40 decreases, a current density $A/cm^2$ and EQE are changed.

In a manufacturing method according to an embodiment, the active layer 40 and the p-type semiconductor layer 50 may not be etched, and the resistance layer 70 may be formed on the p-type semiconductor layer 50. Thereafter, the p-type electrode 60 may be formed on the resistance layer 70. Here, the resistance layer 70 may be a layer including a high resistor and a low resistor. For example, when seeing the resistance layer 70 from above, an outer region of the resistance layer 70 may include a high resistor, and an inner region of the resistance layer 70 may include a low resistor.

According to the embodiment, holes injected by the p-type electrode 60 may pass through the low resistor, i.e., the inner region of the resistance layer 70, and may not pass through the high resistor, i.e., the outer region of the resistance layer 70. Since the holes passing through the inner region of the resistance layer 70 are injected into the p-type semiconductor layer 50, an actual effective area of the p-type semiconductor layer 50 may decrease. Also, an effective area of the active layer 40 may decrease in proportion to the decrease in the effective area of the p-type semiconductor layer 50.

According to the embodiment, since the p-type semiconductor layer 50 and the active layer 40 are not etched, and the resistance layer 70 including the high resistor and the low resistor is formed on the p-type semiconductor layer 50, actual effective areas of the active layer 40 and the p-type semiconductor layer 50 may decrease.

FIGS. 3A through 3H are cross-sectional views illustrating a method of manufacturing the LED 100 according to an embodiment.

Figure 3A:
FIGS. 3A through 3H are cross-sectional views illustrating a method of manufacturing an LED according to an embodiment.
Figure 3B:
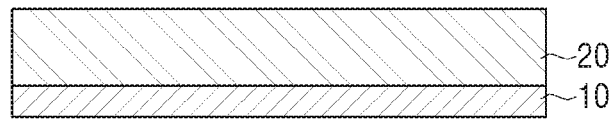
Figure 3C:
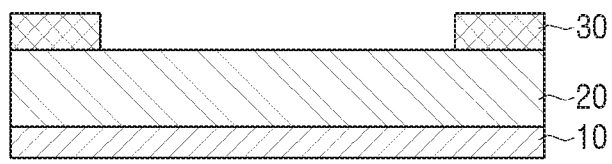
Figure 3D:
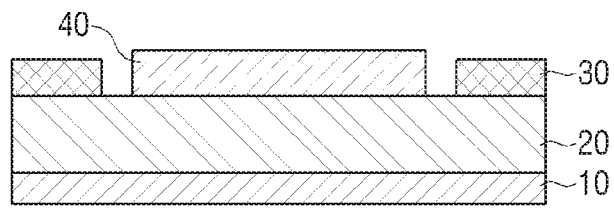
Figure 3E:
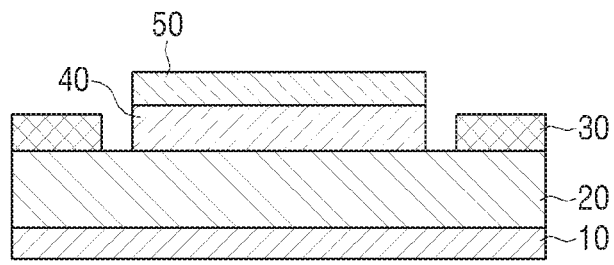

Referring to FIGS. 3A and 3B, in the method of manufacturing the LED 1000 according to an embodiment, the substrate 10 may be provided, and the n-type semiconductor layer 20 (or an n-type semiconductor base layer) may be grown on the substrate 10.

Thereafter, referring to FIGS. 3C through 3F, the n-type electrodes 30, the active layer 40, the p-type semiconductor layer 50, and the p-type electrode 60 may be sequentially deposited.

Figure 3F:
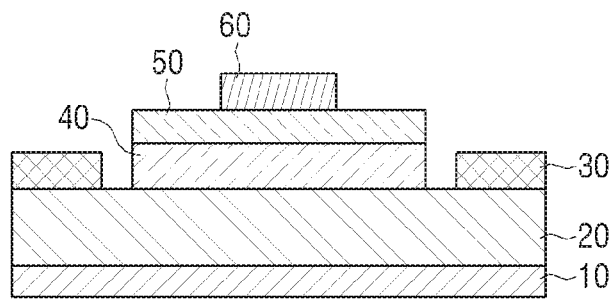
Figure 3G:
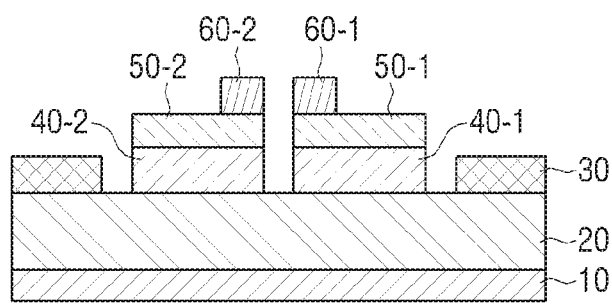

Referring to FIG. 3G, a portion of a region where the active layer 40, the p-type semiconductor layer 50, and the p-type electrode 60 are stacked may be etched from the p-type electrode 60 to the active layer 40.

As shown in FIGS. 3G and 3F, an area of the p-type electrode 60 may be different from areas of the active layer 40 and the p-type semiconductor layer 50. A portion of a region where the active layer 40, the p-type semiconductor layer 50, and the p-type electrode 60 are all stacked may be etched from the p-type electrode 60 to the active layer 40. For example, the n-type semiconductor layer 20 formed underneath the active layer 40 may not be etched. In this case, the active layer 40 may be divided into first and second active layers 40-1 and 40-2, the p-type semiconductor layer 50 may be divided into first and second p-type semiconductor layers 50-1 and 50-2, and the p-type electrode 60 may be divided into first and second p-type electrodes 60-1 and 60-2.

However, embodiments are not limited thereto, and etching may be performed from the p-type electrode 60 to a preset depth of the n-type semiconductor layer 20.

Figure 3H:
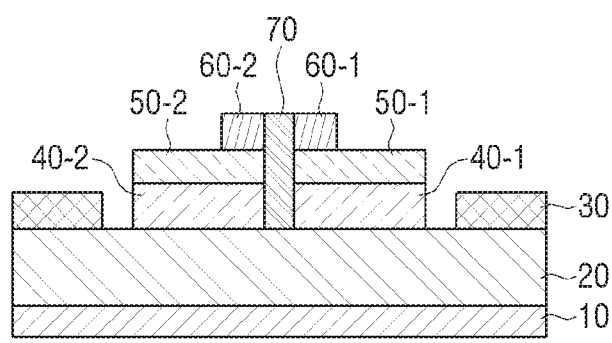

Referring to FIG. 3H, the resistance layer 70 may be formed in the etched region. According to an embodiment, an insulating layer may be formed in an etched region so as to be connected from the p-type electrode 60 to the active layer 40. However, embodiments are not limited thereto, and if etching is performed to a preset depth of the n-type semiconductor layer 20, an insulating layer may be formed so as to be connected from the p-type electrode 60 to the preset depth of the n-type semiconductor layer 20.

For example, the resistance layer 70 may include a high resistor and may be formed by filling an etched region with the high resistor. As another example, the resistance layer 70 may include an insulating layer formed of an insulating material blocking an electrical connection and may be formed by filling an etched region with the insulating material.

Here, the insulating layer may be formed of polyimide, SiNx, or the like, may be formed of a material having larger bandgap energy than the active layer 40, or may include AlGaN or AlInGaN. However, the insulating material is not limited thereto and may be formed of various types of insulating materials capable of blocking an electrical connection between materials.

Figure 4:
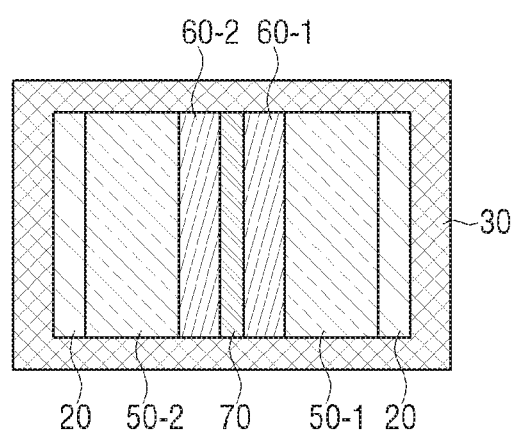
FIG. 4 is a plan view illustrating an LED according to an embodiment.

FIG. 4 is a plan view illustrating an LED according to an embodiment.

When the resistance layer 70 is formed, the p-type electrode 60 may be divided into the first p-type electrode 60-1 and the second p-type electrode 60-2 by the resistance layer 70. Here, the first p-type electrode 60-1 and the second p-type electrode 60-2 may not be connected to each other and may be insulated from each other.

Since the resistance layer 70 is formed so as to be connected from the p-type electrode 60 to the active layer 40, the active layer 40 and the p-type semiconductor layer 50 may be divided besides the p-type electrode 60. For example, the active layer 40 may be divided into the first active layer 40-1 and the second active layer 40-2, and the p-type semiconductor layer 50 may be divided into the first p-type semiconductor layer 50-1 and the second p-type semiconductor layer 50-2.

Figure 5A:
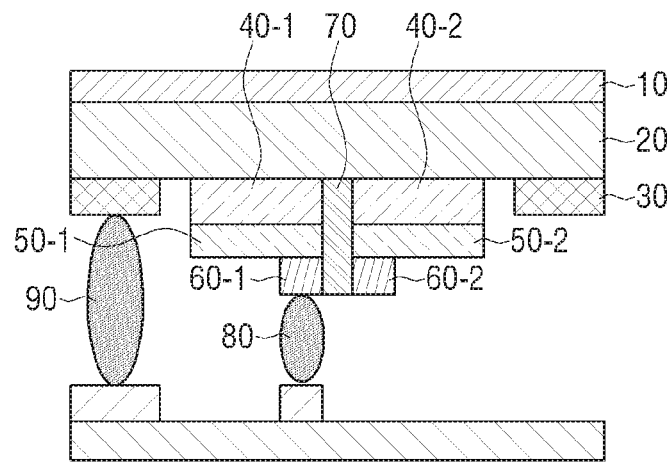
FIGS. 5A and 5B are cross-sectional views illustrating an LED having a flip chip structure according to an embodiment.
Figure 5B:
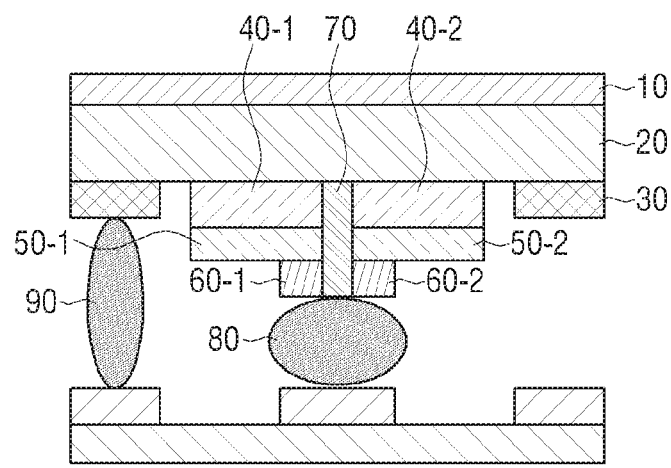

FIGS. 5A and 5B are cross-sectional views illustrating an LED having a flip chip structure according to an embodiment.

As shown in FIG. 5A, flip chip bonding may be used when packaging the LED 1000. Here, the flip chip bonding refers to a process of forming bumps toward the n-type and p-type electrodes 30 and 60 of the LED 1000, turning the LED 1000 upside down, i.e., overturning the LED 1000 (e.g., by using a bottom emission method), and bonding the LED 1000 to a package substrate by using a soldering method or a thermal sonic method.

However, embodiments are not limited thereto. For example when the LED 1000 is bonded to the package substrate, a top emission method, different from the bottom emission method described with reference to FIGS. 5A and 5B, may be applied. Hereinafter, as an example, the bottom emission method will be described as being used. However, various embodiments may be applied to the top emission method.

Detailed processes and methods of bump bonding and flip chip bonding used in a process of packaging the LED 1000 having a flip chip structure are well-known technologies.

The active layer 40 may be divided into the first active layer 40-1 and the second active layer 40-2 by the resistance layer 70. Also, the p-type semiconductor layer 50 may be divided into the first p-type semiconductor layer 50-1 and the second p-type semiconductor layer 50-2.

According to an embodiment, an n-type pad 90 may be formed on the n-type electrode 30, and a p-type pad 80 may be formed on the p-type electrode 60. Here, the n-type pad 90 and the p-type pad 80 may be respectively bonded to bumps on a package substrate, i.e., on a backplane. As the n-type pad 90 and the p-type pad 80 are bonded to the bumps, the n-type electrode 30 and the p-type electrode 60 may respectively inject electrons and holes into the n-type semiconductor layer 20 and the p-type semiconductor layer 50.

In the LED 1000 according to an embodiment, the p-type pad 80 may be formed only on one of the first p-type electrode 60-1 and the second p-type electrode 60-2 divided by the resistance layer 70. For example, the p-type pad 80 may be formed only on the first p-type electrode 60-1. In this case, the first p-type electrode 60-1 may inject holes into the first p-type semiconductor layer 50-1, and light may be emitted from the first active layer 40-1 by recombination of electrons and holes. On the contrary, the second p-type electrode 60-2 may not inject holes into the second p-type semiconductor layer 50-2, and light may not be emitted from the second active layer 40-2.

Accordingly, while a size of the LED 1000 or a size of a chip is not changed, an effective area of the active layer 40 may be reduced to the first active layer 40-1.

According to an embodiment, as shown in FIG. 5B, the p-type pad 80 may be formed so as to be connected to both of the first p-type electrode 60-1 and the second p-type electrode 60-2. If the p-type pad 80 is connected to the first p-type electrode 60-1 and the second p-type electrode 60-2, the first active layer 40-1 and the second active layer 40-2 respectively emit light.

If the p-type pad 80 is connected only to the first p-type electrode 60-1, light may be emitted from only one of the first and second active layers 40-1 and 40-2. If the p-type pad 80 is connected to both of the first and second p-type electrodes 60-1 and 60-2, light may be emitted from both of the first and second active layers 40-1 and 40-2.

The LED 1000 according to an embodiment may use the bottom emission method and may include a reflective layer.

For example, since light emitted from the active layer 40 is reflected from the reflective layer and then emitted through the substrate 10 that is a transparent sapphire substrate, extraction efficiency of the light may be improved.

The LED 1000 may include a fluorescent substance. The fluorescent substance may be a kind of luminescent material, i.e., may be a quantum dot or the like as a material emitting red (R), green (G), and blue (B) lights and the like by absorbing energy. The fluorescent substance may be stacked on the substrate 10. If the fluorescent substance is stacked, a characteristic of the substrate 10 is distinguished. For example, the LED 1000 may emit light, and the fluorescent substance may be stacked on the substrate 10 so as to operate as one of R, G, and B sub pixels. However, embodiments are not limited thereto, and the LED 1000 may emit B light and may operate as the B sub pixel if the fluorescent substance is not stacked.

Figure 6:
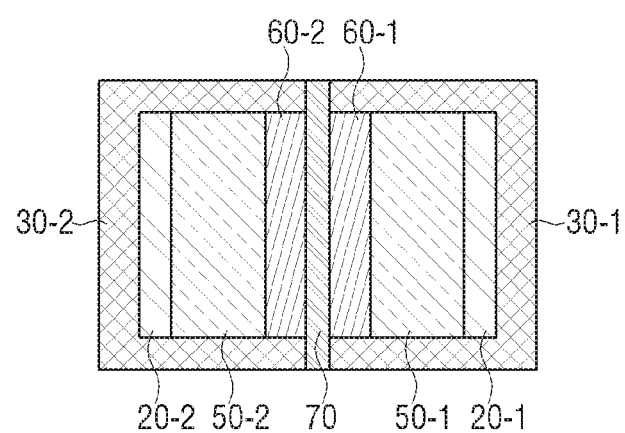
FIG. 6 is a plan view illustrating an LED according to an embodiment.

FIG. 6 is a plan view illustrating an LED according to an embodiment.

According to an embodiment, the n-type electrode 30 may be formed in a first region of the n-type semiconductor layer 20 after the n-type semiconductor layer 20 is formed on the substrate 10. Here, the first region may be an outer region of the n-type semiconductor layer 20. Here, the outer region refers to an outer peripheral region having a rectangular structure when viewing the LED 1000 from above. Also, a region other than the outer region refers to an other region other than the above-described outer region, i.e., a region of an inner region.

The active layer 40 may be formed in a second region of the inner region on the n-type semiconductor layer 20. Here, the second region may be a rectangular region including a central portion of the inner region other than the outer region on the n-type semiconductor layer 20.

In a manufacturing method according to an embodiment, a region may be etched from the p-type electrode 60 to the n-type semiconductor layer 20 in a region where the n-type semiconductor layer 20, the active layer 40, the p-type semiconductor layer 50, and the p-type electrode 60 are stacked.

According to an embodiment, a region of the n-type electrode 30 may be etched. For example, a region of each of the n-type semiconductor layer 20, the active layer 40, the p-type semiconductor layer 50, the p-type electrode 60, and the n-type electrode 30 may be etched so as to cross to a portion of the n-type electrode 30 formed at an other edge facing an edge on the n-type electrode 30.

The resistance layer 70 may be formed in the etched region.

A plan view of the LED 1000 where the resistance layer 70 is formed in the etched region is as shown in FIG. 6. If the resistance layer 70 is formed, the n-type semiconductor layer 20 may be divided into a first n-type semiconductor layer 20-1 and a second n-type semiconductor layer 20-2. Also, the n-type electrode 30 may be divided into a first n-type electrode 30-1 and a second n-type electrode 30-2.

Here, the first n-type semiconductor layer 20-1 and the second n-type semiconductor layer 20-2 may not be connected to each other but may be insulated from each other, and the first n-type electrode 30-1 and the second n-type electrode 30-2 may not be connected to each other but may be insulated from each other. In other words, in the LED 1000 of the embodiment described with reference to FIGS. 4 through 5B, the n-type semiconductor layer 20 and the n-type electrode 30 may be additionally divided by the resistance layer 70.

Figure 7A:
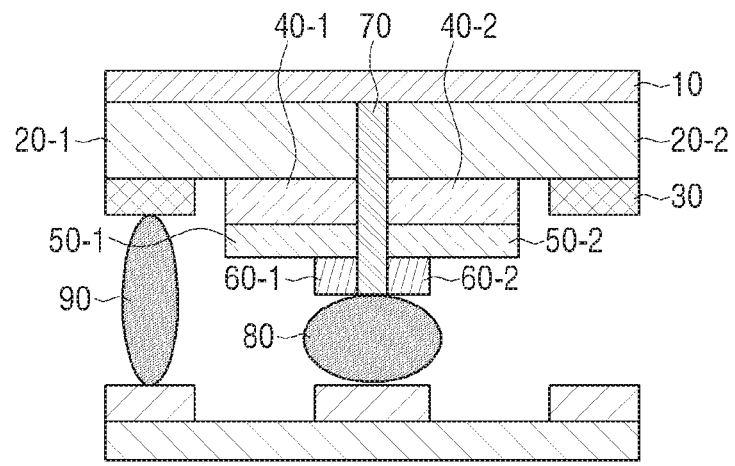
FIGS. 7A and 7B are cross-sectional views illustrating an LED having a flip chip structure according to an embodiment.
Figure 7B:
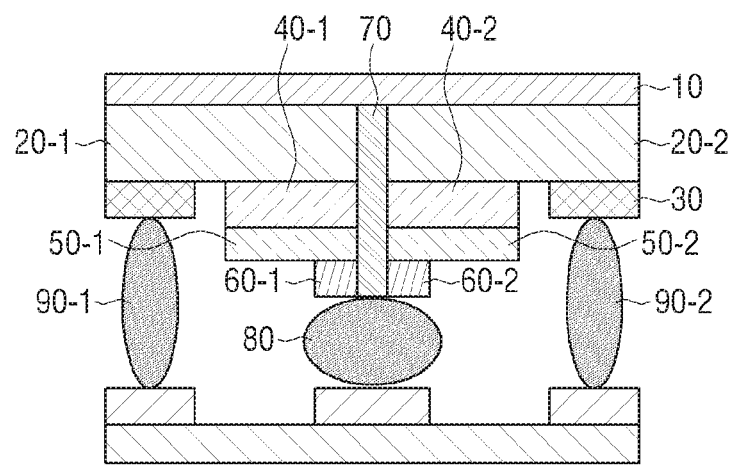

FIGS. 7A and 7B are cross-sectional views illustrating an LED having a flip chip structure according to an embodiment.

In the LED 1000 according to an embodiment, the n-type pad 90 may be formed only on one of the first n-type electrode 30-1 and the second n-type electrode 30-2 divided by the resistance layer 70. For example, the n-type pad 90 may be formed only on the first n-type electrode 30-1. In this case, the first n-type electrode 30-1 may inject electrons into the first n-type semiconductor layer 20-1, and light may be emitted from the first active layer 40-1 by recombination of electrons and holes. On the contrary, the second n-type electrode 30-2 may not inject electrons into the second n-type semiconductor layer 20-2, and light may not be emitted from the second active layer 40-2.

As a result, while a size of the LED 1000 or a size of a chip is not changed, an effective area of the active layer 40 may be reduced to the first active layer 40-1.

According to an embodiment, as shown in FIG. 7B, the n-type pad 90 may be formed to be connected to both of the first n-type electrode 30-1 and the second n-type electrode 30-2. For example, if a first n-type pad 90-1 is connected to the first n-type electrode 30-1, and a second n-type pad 90-2 is connected to the second n-type electrode 30-2 to be connected to an external substrate, light may be respectively emitted from the first active layer 40-1 and the second active layer 40-2 by injection of electrons and holes.

According to an embodiment, a package substrate may be connected to the n-type electrode 30 and the p-type electrode 60 included in the LED 1000 by using wire bonding.

Figure 8:
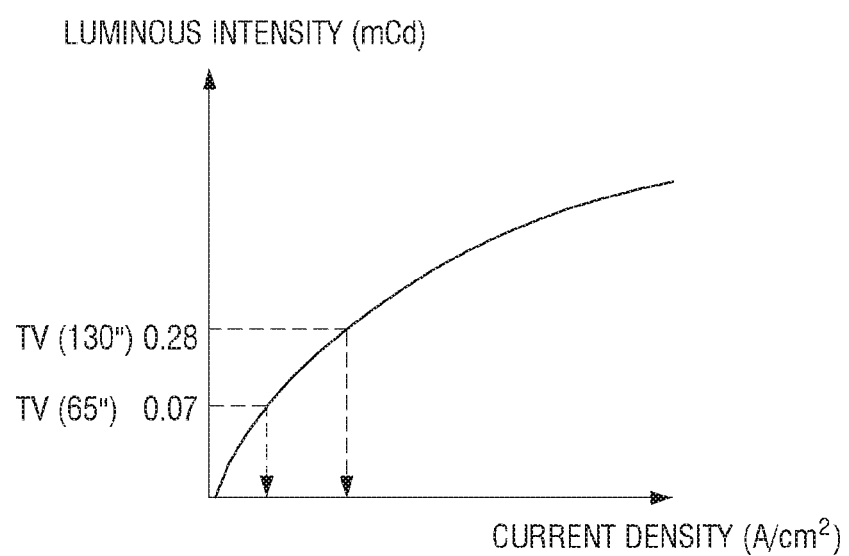
FIG. 8 illustrates graphs for describing output efficiency of an LED according to embodiments.
Figure 8:
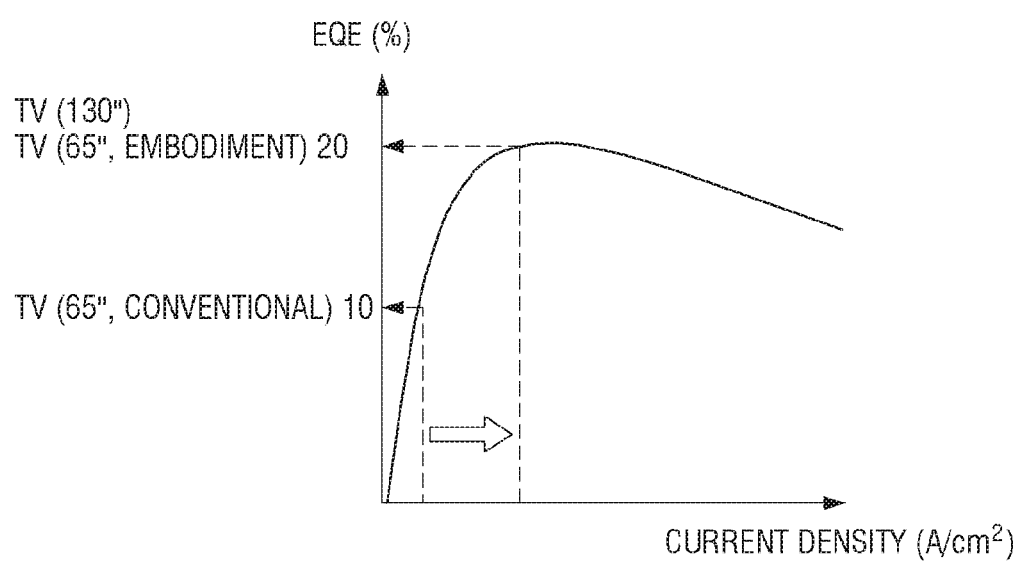

FIG. 8 illustrates graphs for describing output efficiency of an LED according to various embodiments.

The LED 1000 according to an embodiment may be used in display apparatuses having various sizes such as a user terminal apparatus, a TV, and the like. Ppi and luminance of a display may vary according to a size of the display, and thus, a luminous intensity required for each pixel of the display may vary.

For example, a luminous intensity required for each pixel of a 130-inch TV may be 0.28 mCd, and a luminous intensity required for each pixel of a 65-inch TV may be 0.07 mCd. If chip sizes of LEDs respectively installed in displays are the same even when required luminous intensities decrease with decreases in sizes of the displays, the required luminous intensities may be satisfied by reducing currents in the LEDs. However, if only a current is controlled, EQE may decrease. Here, the EQE refers to a value that is calculated based on Equation 1 below, i.e., a value that is acquired by dividing the number of photons emitted into a free space per second P/(hv) by the number of electrons injected into an LED per second I/e.

$$\frac{P/(hv)}{I/e} \quad (1)$$

Table 1 below shows EQE and current intensity when only an amount of current injected into an LED is changed according to a conventional method and an amount of injected current and an effective area of the active layer 40 are changed according to various embodiments when a size of a display is reduced, and a size of the LED is kept the same.

TABLE 1

|  | TV (130") 500 nit/4K | TV (65", Conventional) 500 nit/4K | TV (65", Embodiment) 500 nit/4K |
|---|---|---|---|
| Required Luminous Intensity (mcd) | 0.28 | 0.07 | 0.07 |
| Current (A) | $10 * 10^{-6}$ | $5 * 10^{-6}$ | $2.5 * 10^{-6}$ |
| Effective Area of Active Layer (cm$^2$) | $16 * 10^{-6}$ | $16 * 10^{-6}$ | $4 * 10^{-6}$ |
| Current Intensity (A/cm$^2$) | 0.625 | 0.3125 | 0.625 |
| EQE (%) | 20 | 10 | 20 |
| Voltage (V) | 3 | 3 | 3 |
| Power Consumption (W) | $30 * 10^{-6}$ | $15 * 10^{-6}$ | $7.5 * 10^{-6}$ |

Based on two examples as described above, a difference in a luminous intensity required for each pixel may exceed 1,000 times according to a difference in a size of a display. According to various embodiments, a current intensity may be maintained by reducing an injected current. Therefore, EQE may be equally maintained, and power consumption may be reduced.

Figure 9:
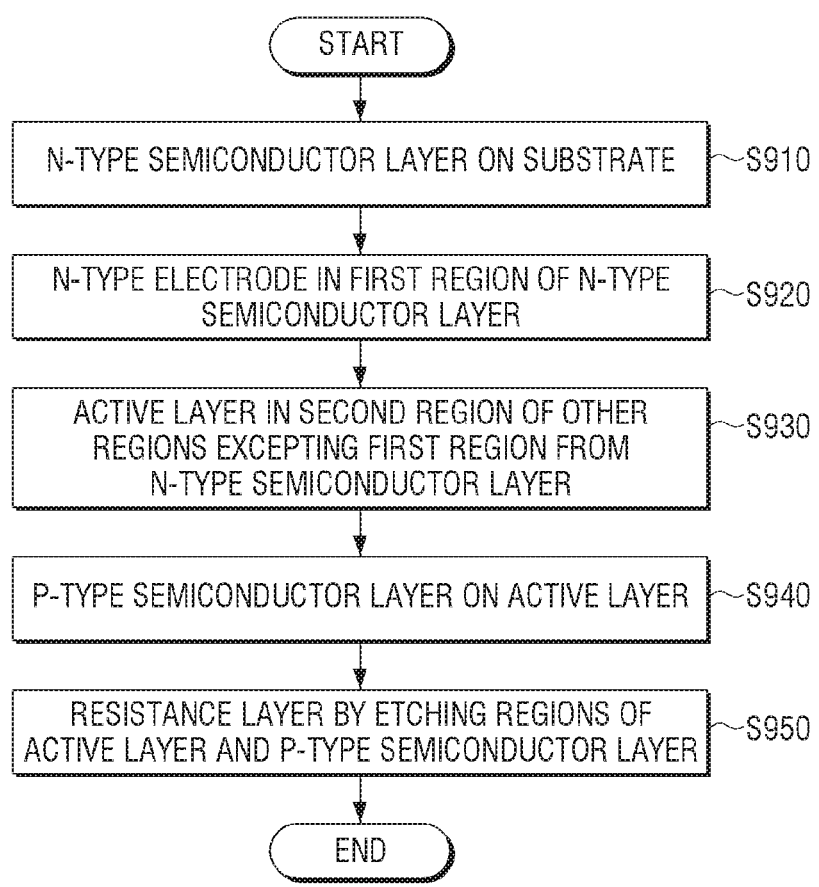
FIG. 9 is a flowchart of a method of manufacturing an LED according to an embodiment.

FIG. 9 is a flowchart of a method of manufacturing an LED according to an exemplary embodiment of the present invention.

In operation S910, an n-type semiconductor layer is formed on a substrate. In operation S920, an n-type electrode is formed in a first region of the n-type semiconductor layer. In operation S930, an active layer is formed in a second region other than the first region from the n-type semiconductor layer. In operation S940, a p-type semiconductor layer is formed on the active layer. In operation S950, a resistance layer is formed by etching regions of the active layer and the p-type semiconductor layer.

Here, operation S950 of forming the resistance layer may include forming a high resistance layer having a resistance value higher than or equal to a preset resistance to the same height as the p-type semiconductor layer by etching at least portions of outer regions of the active layer and the p-type semiconductor layer. Also, the manufacturing method according to the present exemplary embodiment may further include forming a p-type electrode in a region of the p-type semiconductor layer.

Operation S950 of forming the resistance layer may include forming a high resistance layer having a resistance value higher than or equal to a preset resistance to the same height as the p-type semiconductor layer by etching at least portions of outer regions of the active layer and the p-type semiconductor layer and forming a low resistance layer having a resistance value lower than the preset resistance on the p-type semiconductor layer. The manufacturing method according to an embodiment may further include forming a p-type electrode in a region of the low resistance layer.

Also, the manufacturing method may further include forming a p-type electrode on the p-type semiconductor layer, and operation S950 of forming the resistance layer may include forming an insulating layer by etching a portion of a region, where the active layer, the p-type semiconductor layer, and the p-type electrode are stacked, from the p-type electrode to the active layer.

Here, the manufacturing method may further include dividing the p-type electrode into a first p-type electrode and a second p-type electrode by the insulating layer and forming a p-type pad for a connection to an external substrate only on one of the first p-type electrode and the second p-type electrode.

Also, in the manufacturing method according to an embodiment, the first region may be an outer region of the n-type semiconductor layer, and the second region may be a rectangular region including a central portion of an inner region other than the outer region of the n-type semiconductor layer. Operation 950 of forming the resistance layer may include etching a region where the n-type electrode, the n-type semiconductor layer, the active layer, the p-type semiconductor layer, and the p-type electrode are stacked to cross from a portion of the n-type electrode formed at an edge of the first region to a portion of the n-type electrode formed at an other edge facing the edge and forming an insulating layer by filling the etched region with an insulating material.

Here, the manufacturing method may further include dividing the n-type electrode into a first n-type electrode and a second n-type electrode by the insulating layer and forming an n-type pad for a connection to an external substrate only on one of the first n-type electrode and the second n-type electrode.

Also, according to an embodiment, the manufacturing method may further include dividing the n-type electrode into a first n-type electrode and a second n-type electrode by the insulating layer and forming first and second n-type pads for respectively connecting the first n-type electrode and the second n-type electrode to the external substrate on the first n-type electrode and the second n-type electrode.

The various embodiments described above may be embodied in a computer readable recording medium or a similar apparatus by using software, hardware, or a combination thereof. In some cases, the exemplary embodiments described herein may be embodied as a processor. According to the software embodiment, exemplary embodiments such as processes and functions described herein may be embodied as additional software modules. The software modules may respectively perform at least one or more functions and operations described herein.

Computer instructions for performing processing operations according to various exemplary embodiments of the present disclosure described above may be stored on a non-transitory computer-readable medium. When the computer instructions stored on the non-transitory computer-readable medium are executed by a processor, the computer instructions may enable a particular device to perform processing operations according to the above-described various exemplary embodiments.

The non-transitory computer readable medium is a medium which does not store data temporarily such as a register, cash, and memory but stores data semi-permanently and is readable by devices. More specifically, the aforementioned applications or programs may be stored in the non-transitory computer readable media such as compact disks (CDs), digital video disks (DVDs), hard disks, Blu-ray disks, universal serial buses (USBs), memory cards, and read-only memory (ROM).

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a light emitting diode (LED), the method comprising:
    forming an n-type semiconductor layer on a substrate;
    forming an n-type electrode in a first region of the n-type semiconductor layer;
    forming an active layer in a second region of the n-type semiconductor layer, the second region being a region other than the first region;

forming a p-type semiconductor layer on the active layer; and forming a resistance layer in the second region and contacting the active layer and the p-type semiconductor layer, wherein the forming of the resistance layer comprises forming a first resistance layer to a height equal to the p-type semiconductor layer in etched portions of outer regions of the active layer and the p-type semiconductor layer.

2. The method of claim 1, wherein the method further comprises forming a p-type electrode in a region of the p-type semiconductor layer.

3. The method of claim 1, wherein the forming of the resistance layer further comprises:

forming a second resistance layer on the first resistance layer and the p-type semiconductor layer, wherein the method further comprises forming a p-type electrode in a region of the second resistance layer.

4. The method of claim 1, further comprising:

forming a p-type electrode on the p-type semiconductor layer, wherein the forming of the resistance layer comprises forming an insulating layer by etching a portion of a region, where the active layer, the p-type semiconductor layer, and the p-type electrode are stacked, from the p-type electrode to the active layer.

5. The method of claim 4, wherein the p-type electrode is divided into a first p-type electrode and a second p-type electrode by the insulating layer, wherein the method further comprises forming a p-type pad configured to connect only on one of the first p-type electrode and the second p-type electrode to an external substrate.

6. The method of claim 4, wherein the first region is an outer region of the n-type semiconductor layer, and the second region is a rectangular region comprising a central portion of an inner region other than the outer region in the n-type semiconductor layer, wherein the forming of the resistance layer comprises etching a region where the n-type electrode, the n-type semiconductor layer, the active layer, the p-type semiconductor layer, and the p-type electrode are stacked to cross from a portion of the n-type electrode formed at first edge of the first region and a portion of the n-type electrode formed at a second edge opposite to the first edge; and forming the insulating layer by filling the etched region with an insulating material.

7. The method of claim 6, wherein the n-type electrode is divided into a first n-type electrode and a second n-type electrode by the insulating layer, wherein the method further comprises forming an n-type pad configured to connect only on one of the first n-type electrode and the second n-type electrode to an external substrate.

8. The method of claim 6, wherein the n-type electrode is divided into a first n-type electrode and a second n-type electrode by the insulating layer, wherein the method further comprises forming first n-type pad and second n-type pad to respectively connect the first n-type electrode and the second n-type electrode to an external substrate.

9. A light emitting diode (LED) comprising:
a substrate;
an n-type semiconductor layer formed on the substrate;
an n-type electrode formed in a first region of the n-type semiconductor layer;
an active layer formed in a second region of the n-type semiconductor layer, the second region being a region other than the first region;
a p-type semiconductor layer formed on the active layer; and
a resistance layer formed in the second region and contacting the active layer and the p-type semiconductor layer, wherein the resistance layer comprises a first resistance layer formed to a height equal to the p-type semiconductor layer in etched portions of outer regions of the active layer and the p-type semiconductor layer.

10. The LED of claim 9, wherein the LED further comprises a p-type electrode formed in a region of the p-type semiconductor layer.

11. The LED of claim 9, wherein the resistance layer further comprises:

a second resistance layer formed on the first resistance layer and the p-type semiconductor layer, wherein the LED further comprises a p-type electrode formed in a region of the second resistance layer.

12. The LED of claim 9, further comprising:

a p-type electrode formed on the p-type semiconductor layer, wherein the resistance layer comprises an insulating layer connecting the p-type electrode to the active layer in a region where the active layer, the p-type semiconductor layer, and the p-type electrode are stacked.

13. The LED of claim 12, wherein the p-type electrode is divided into a first p-type electrode and a second p-type electrode by the insulating layer, wherein the LED further comprises a p-type pad connecting only one of the first p-type electrode and the second p-type electrode to an external substrate.

14. The LED of claim 12, wherein the first region is an outer region of the n-type semiconductor layer, and the second region is a rectangular region comprising a central portion of an inner region other than the outer region in the n-type semiconductor layer, wherein the insulating layer is formed to cross from a portion of the n-type electrode formed at a first edge of the first region and a portion of the n-type electrode formed at a second edge opposite to the first edge in a region where the n-type semiconductor layer, the active layer, the p-type semiconductor layer, and the p-type electrode are stacked.

15. The LED of claim 14, wherein the n-type electrode is divided into a first n-type electrode and a second n-type electrode by the insulating layer, wherein the LED further comprises an n-type pad connecting only one of the first n-type electrode and the second n-type electrode to an external substrate.

16. The LED of claim 14, wherein the n-type electrode is divided into a first n-type electrode and a second n-type electrode by the insulating layer, wherein the LED further comprises a first n-type pad and a second n-type pad respectively formed on the first n-type electrode and the second n-type electrode respectively connecting the first n-type electrode and the second n-type electrode to an external substrate.

* * * * *